(12) United States Patent
Liu et al.

(10) Patent No.: US 10,290,616 B2
(45) Date of Patent: May 14, 2019

(54) WELD JOINT WITH CONSTANT OVERLAP AREA

(71) Applicant: Galatech, Inc., Milpitas, CA (US)

(72) Inventors: Wenjun Liu, Santa Clara, CA (US); Robert James Ramm, Mountain View, CA (US)

(73) Assignee: GALATECH, INC., Milpitas, CA (US)

( * ) Notice: Subject to any disclaimer, the term of this patent is extended or adjusted under 35 U.S.C. 154(b) by 0 days.

(21) Appl. No.: 15/861,599

(22) Filed: Jan. 3, 2018

(65) Prior Publication Data
US 2019/0051638 A1 Feb. 14, 2019

Related U.S. Application Data

(63) Continuation-in-part of application No. 15/675,615, filed on Aug. 11, 2017, now Pat. No. 9,948,208.

(51) Int. Cl.
| | |
|---|---|
| H01L 21/50 | (2006.01) |
| H01L 25/11 | (2006.01) |
| H01L 23/50 | (2006.01) |
| H01L 23/482 | (2006.01) |
| H01L 21/60 | (2006.01) |
| H02M 7/537 | (2006.01) |

(52) U.S. Cl.
CPC ............ *H01L 25/115* (2013.01); *H01L 21/50* (2013.01); *H01L 23/4822* (2013.01); *H01L 23/50* (2013.01); *H01L 2021/60007* (2013.01); *H02M 7/537* (2013.01)

(58) Field of Classification Search
CPC ...... H02M 7/003; H02M 7/537; H02M 1/143; H05K 7/02; H05K 7/06; H05K 3/3415; H05K 3/3421; H05K 3/3447
See application file for complete search history.

(56) References Cited

U.S. PATENT DOCUMENTS

| | | | |
|---|---|---|---|
| 4,398,124 A * | 8/1983 | Kohl | ........................ H01K 1/66 174/84 C |
| 5,623,399 A | 4/1997 | Ishii et al. | |
| 8,653,652 B2 | 2/2014 | Tokuyama et al. | |
| 2011/0193619 A1* | 8/2011 | Parikh | ................. H01L 21/8258 327/534 |
| 2014/0268969 A1 | 9/2014 | Crouch et al. | |
| 2016/0013706 A1 | 1/2016 | Mukunoki | |
| 2017/0310318 A1 | 10/2017 | Kamiya et al. | |

OTHER PUBLICATIONS

Liu, Notice of Allowance, U.S. Appl. No. 15/675,615, dated Feb. 13, 2018, 8 pgs.
Liu, Office Action, U.S. Appl. No. 15/831,307, dated Mar. 22, 2018, 18 pgs.

* cited by examiner

*Primary Examiner* — Matthew V Nguyen
(74) *Attorney, Agent, or Firm* — Morgan, Lewis & Bockius, LLP

(57) ABSTRACT

A packaged semiconductor device has a plurality of leads. A respective lead is to be welded to an electrical coupling that has a substantially rectangular end section. The end section has a width that is greater than a width of the respective lead. The respective lead is aligned within the width of the end section, such that the respective lead extends in a direction substantially perpendicular to the width of the end section. With the respective lead and the end section aligned, the respective lead is welded to the end section.

11 Claims, 13 Drawing Sheets

WELD JOINT WITH CONSTANT OVERLAP AREA

RELATED APPLICATION

This is a continuation-in part of U.S. patent application Ser. No. 15/675,615, filed Aug. 11, 2017, entitled "Inverter Capacitor with Phase-Out Bus Bar," which is incorporated by reference in its entirety.

TECHNICAL FIELD

This relates generally to welding, including but not limited to welding performed when assembling high-voltage electronics such as power inverters.

BACKGROUND

Welding electrical components presents significant challenges. For example, variation in alignment between components being welded together, such as electrical leads and corresponding electrical couplings, can affect the quality of the weld joints. Preventing such variation from causing low-quality weld joints is particularly important in high-voltage electronic systems (e.g., power inverters), because low-quality weld joints interfere with proper current conduction and thus degrade performance.

SUMMARY

According, there is a need for methods that allow for the reliable formation of high-quality weld joints, and for apparatuses that can reliably be manufactured with high-quality weld joints.

In some embodiments, a method includes providing a packaged semiconductor device having a plurality of leads and providing an electrical coupling that has a substantially rectangular end section. The end section has a width that is greater than a width of a respective lead of the plurality of leads. The method also includes aligning the respective lead within the width of the end section, wherein the respective lead extends in a direction substantially perpendicular to the width of the end section. The method further includes, with the respective lead and the end section aligned, welding the respective lead to the end section.

In some embodiments, an apparatus includes a packaged semiconductor device having a plurality of leads and also includes an electrical coupling that has a substantially rectangular end section. The end section has a width that is greater than a width of a respective lead of the plurality of leads. The respective lead is aligned within the width of the end section and welded to the end section. The respective lead extends in a direction substantially perpendicular to the width of the end section.

BRIEF DESCRIPTION OF THE DRAWINGS

For a better understanding of the various described implementations, reference should be made to the Detailed Description below, in conjunction with the following drawings in which like reference numerals refer to corresponding parts throughout the figures.

Like reference numerals refer to corresponding parts throughout the drawings and specification.

DETAILED DESCRIPTION

Reference will now be made in detail to implementations, examples of which are illustrated in the accompanying drawings. In the following detailed description, numerous specific details are set forth in order to provide a thorough understanding of the various described implementations. However, it will be apparent to one of ordinary skill in the art that the various described implementations may be practiced without these specific details. In other instances, well-known methods, procedures, components, circuits, and networks have not been described in detail so as not to unnecessarily obscure aspects of the implementations.

Many modifications and variations of this disclosure can be made without departing from its spirit and scope, as will be apparent to those skilled in the art. The specific implementations described herein are offered by way of example only, and the disclosure is to be limited only by the terms of the appended claims, along with the full scope of equivalents to which such claims are entitled.

Figure 1A:
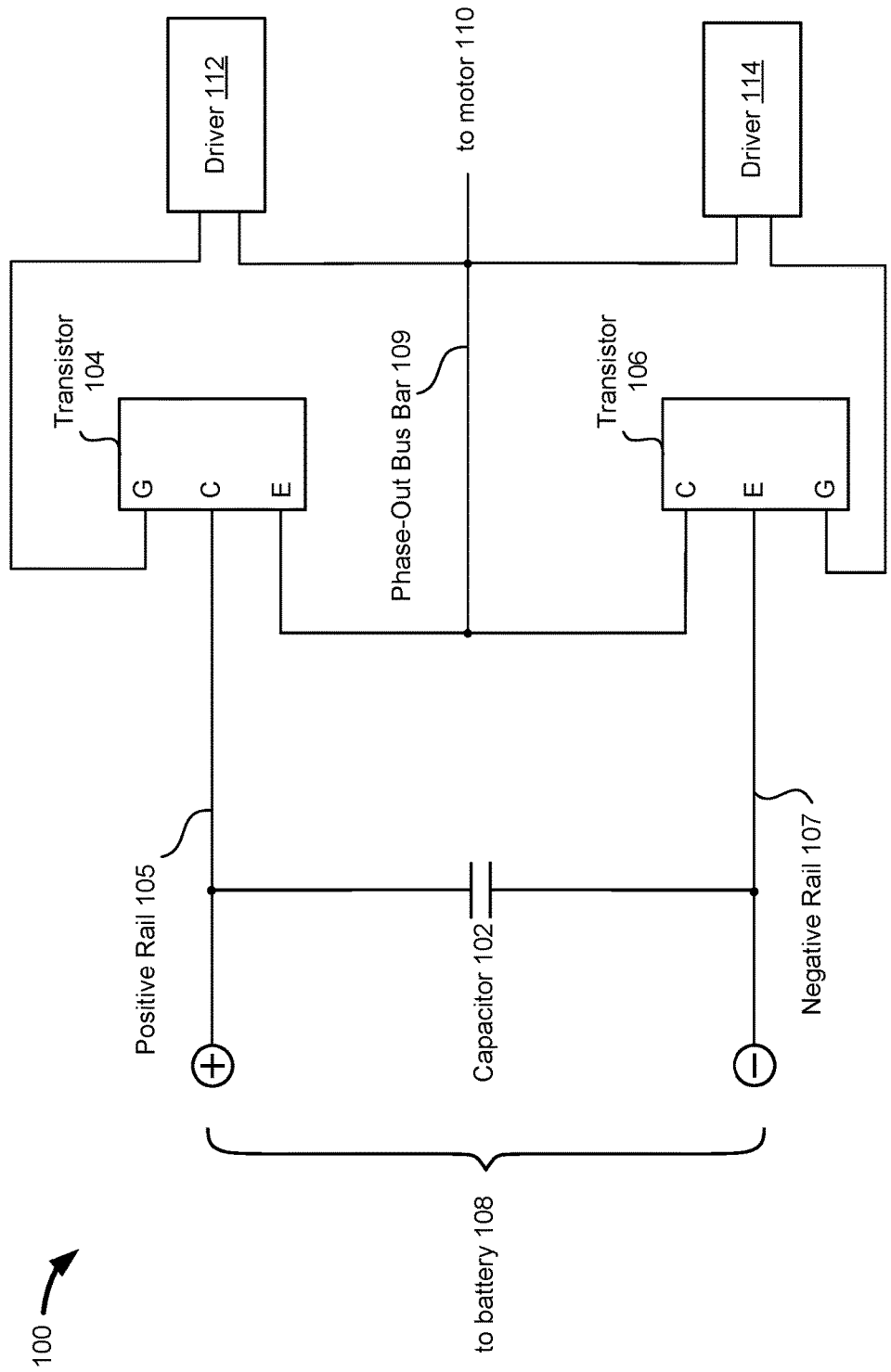
FIG. 1A is a schematic diagram illustrating components of an inverter in accordance with some implementations.

FIG. 1A is a schematic diagram illustrating components of an inverter 100 in accordance with some implementations. The inverter 100 includes a capacitor 102 electrically coupled to transistors 104 and 106 via positive rail 105 and negative rail 107. The positive rail 105 and negative rail 107 may be implemented as respective bus bars. The positive rail 105 and transistor 104 are electrically coupled to a positive terminal of the capacitor 102, while the negative rail 107 and transistor 106 are electrically coupled to a negative terminal of the capacitor 102. The negative rail 107 is further coupled to a negative terminal of a battery 108 and the positive rail is further coupled to a positive terminal of the battery 108.

In accordance with some implementations, direct current (DC) from the battery 108 is converted by the inverter 100 to alternating current (AC) and provided to a motor 110. A phase-out bus bar 109, which connects the transistors 104 and 106, provides the AC to the motor 110.

In various implementations, the capacitor 102 is a wound film capacitor, ceramic capacitor, or electrolytic capacitor. In some implementations, the capacitor 102 is composed of a plurality of energy-storage components (i.e., capacitor components) coupled to one another in parallel.

In some implementations (e.g., as shown in FIG. 1A), the transistors 104 and 106 are bipolar transistors, such as insulated-gate bipolar transistors (IGBTs) that each include a gate terminal ("G"), a collector terminal ("C"), and an emitter terminal ("E"). In other implementations, one or more (e.g., all) of the transistors 104 and 106 are field-effect transistors (FETs), such as metal-oxide semiconductor field-effect transistors (MOSFETs) (e.g., silicon carbide (SiC) MOSFETs) or gallium-nitride (GaN) FETs, that each include a gate terminal and two source/drain terminals.

As shown in FIG. 1A, the collector terminal of the transistor 104 is coupled to the positive terminal of the capacitor 102 via the positive rail 105. The emitter terminal of the transistor 104 is coupled to the collector terminal of the transistor 106 via the phase-out bus bar 109. The emitter terminal of the transistor 106 is coupled to the capacitor 102 via negative rail 107.

The gate terminal of the transistor 104 is coupled to a driver 112 and the gate terminal of the transistor 106 is coupled to a driver 114. In some implementations, the drivers 112 and 114 comprise driver circuitry (e.g., respective integrated circuits) on a printed circuit board (PCB), such as board 702 in FIG. 7. The drivers 112 and 114 switch the transistors 104 and 106 on and off in an alternating manner, thus alternatingly coupling the phase-out bus bar 109 to the positive rail 105 and negative rail 107, to produce AC on the phase-out bus bar.

Figure 1B:
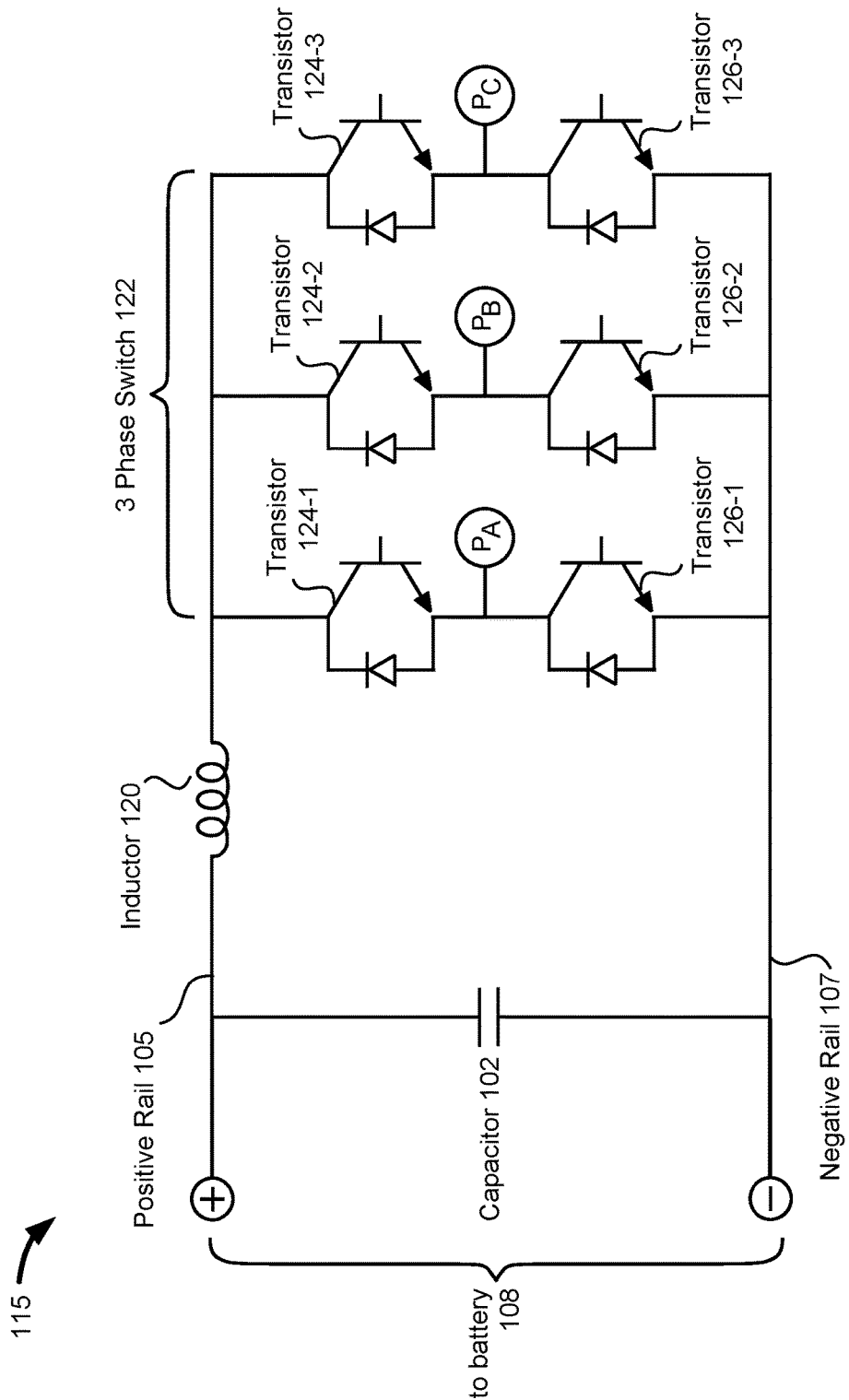
FIG. 1B is a schematic diagram illustrating components of a three-phase inverter in accordance with some implementations.
Figure 5:
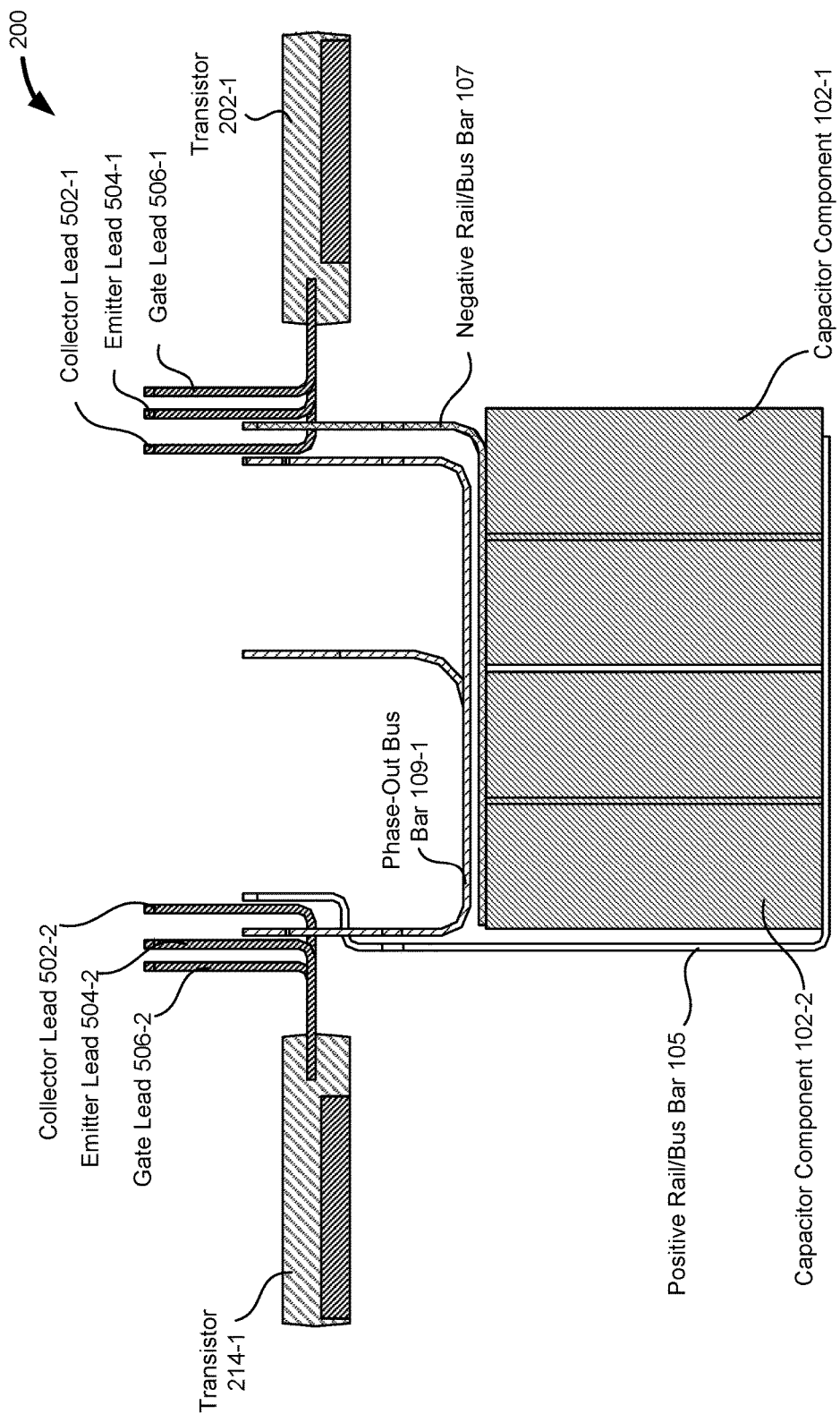
FIG. 5 illustrates a cross-sectional view of an inverter (e.g., the three-phase inverter of FIG. 2) in accordance with some implementations.

FIG. 1B is a schematic diagram illustrating a three-phase inverter 115 in accordance with some implementations. The inverter 115 includes a capacitor 102 coupled to a three-phase switch 122 via the positive rail 105 and negative rail 107. An inductor 120 on positive rail 105 represents commutating inductance between the rails and phase-out bus bars. This inductance 120, which is a parasitic inductance, is reduced (e.g., minimized) by reducing area between the rails 105 and 107 and the phase-out bus bars (e.g., as shown in FIG. 5). (A commutating inductance is also present in the inverter 100 but is not shown in FIG. 1A for simplicity.)

The three-phase switch 122 includes transistors 124 (124-1, 124-2, and 124-3) coupled to the capacitor 102 via the positive rail 105 and transistors 126 (126-1, 126-2, and 126-3) coupled to the capacitor 102 via the negative rail 107. Pairs of transistors 124-1 and 126-1, 124-2 and 126-2, and 124-3 and 126-3 are each coupled in series between the positive rail 105 and negative rail 107. In some implementations, the transistors 124 are coupled to the positive rail 105 via respective collector terminals, and the transistors 126 are coupled to the negative rail 107 via respective emitter terminals (e.g., the transistors 124 and 126 are IGBTs). In some implementations, the transistors 124 and 126 are FETs (e.g., SiC MOSFETs or GaN FETs); the transistors 124 are coupled to the positive rail 105 via respective source/drain terminals and the transistors 126 are coupled to the negative rail 107 via respective source/drain terminals. The inverter 115 further includes three phase-out bus bars, denoted $P_A$, $P_B$, and $P_C$, which are coupled between respective terminals of respective pairs of the transistors 124 and 126. For example, $P_A$, $P_B$, and $P_C$ are coupled to the respective emitter terminals of transistors 124 and collector terminals of transistors 126: $P_A$ is coupled to the emitter terminal of transistor 124-1 and to the collector terminal of transistor 126-1, $P_B$ is coupled to the emitter terminal of transistor 124-2 and to the collector terminal of transistor 126-2, and $P_C$ is coupled to the emitter terminal of transistor 124-3 and to the collector terminal of transistor 126-3. The transistors are driven by drivers (e.g., drivers 112 and 114, FIG. 1A). The timing of the drivers is varied between the pairs of transistors 124 and 126, such that each phase-out bus bar $P_A$, $P_B$, and $P_C$ provides a distinct phase of AC. In some implementations, the phase-out bus bars are coupled to a motor, such as the motor 110 (FIG. 1A).

Figure 2:
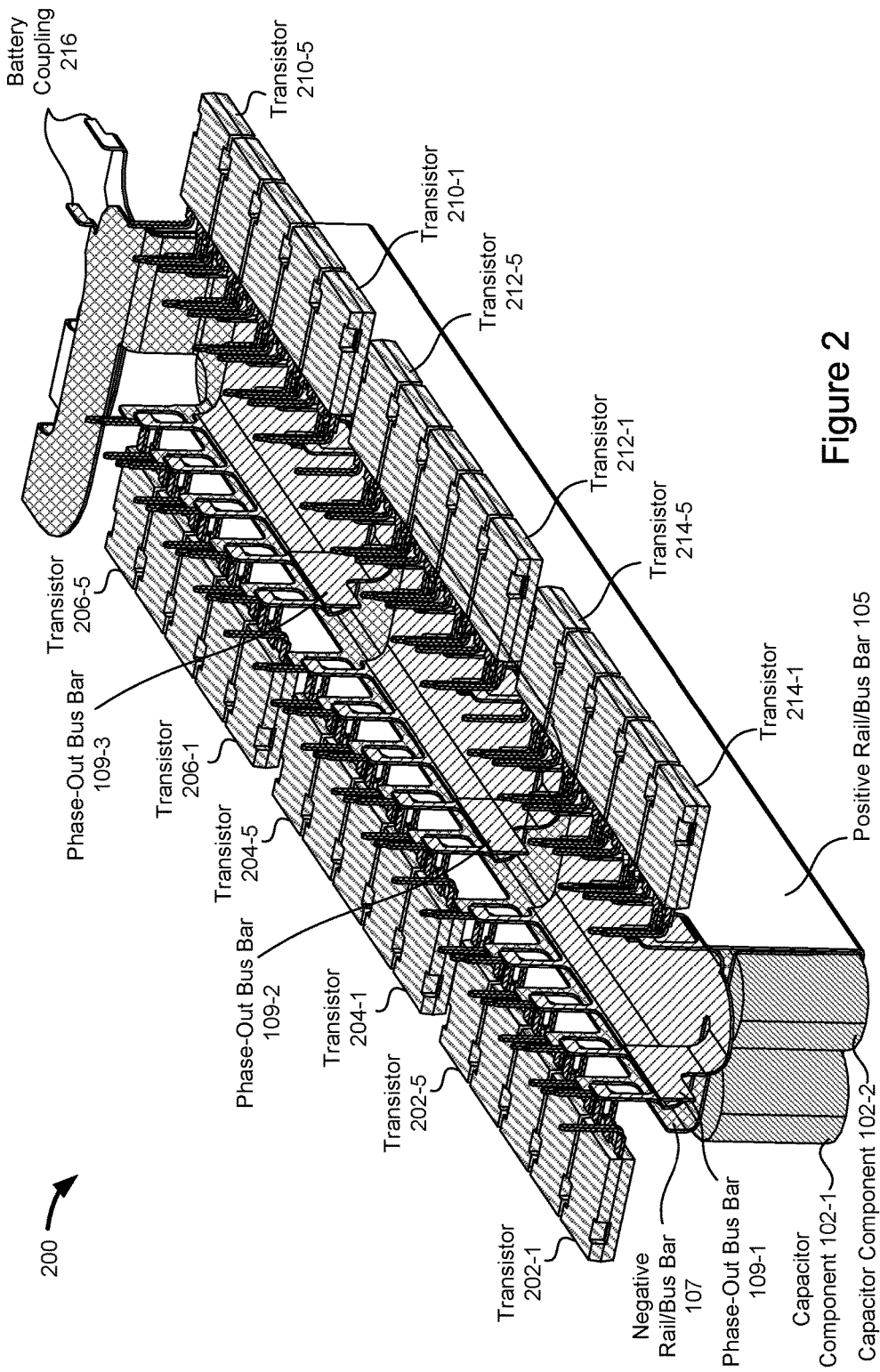
FIG. 2 is a perspective diagram illustrating components of a three-phase inverter in accordance with some implementations.
Figure 3A:
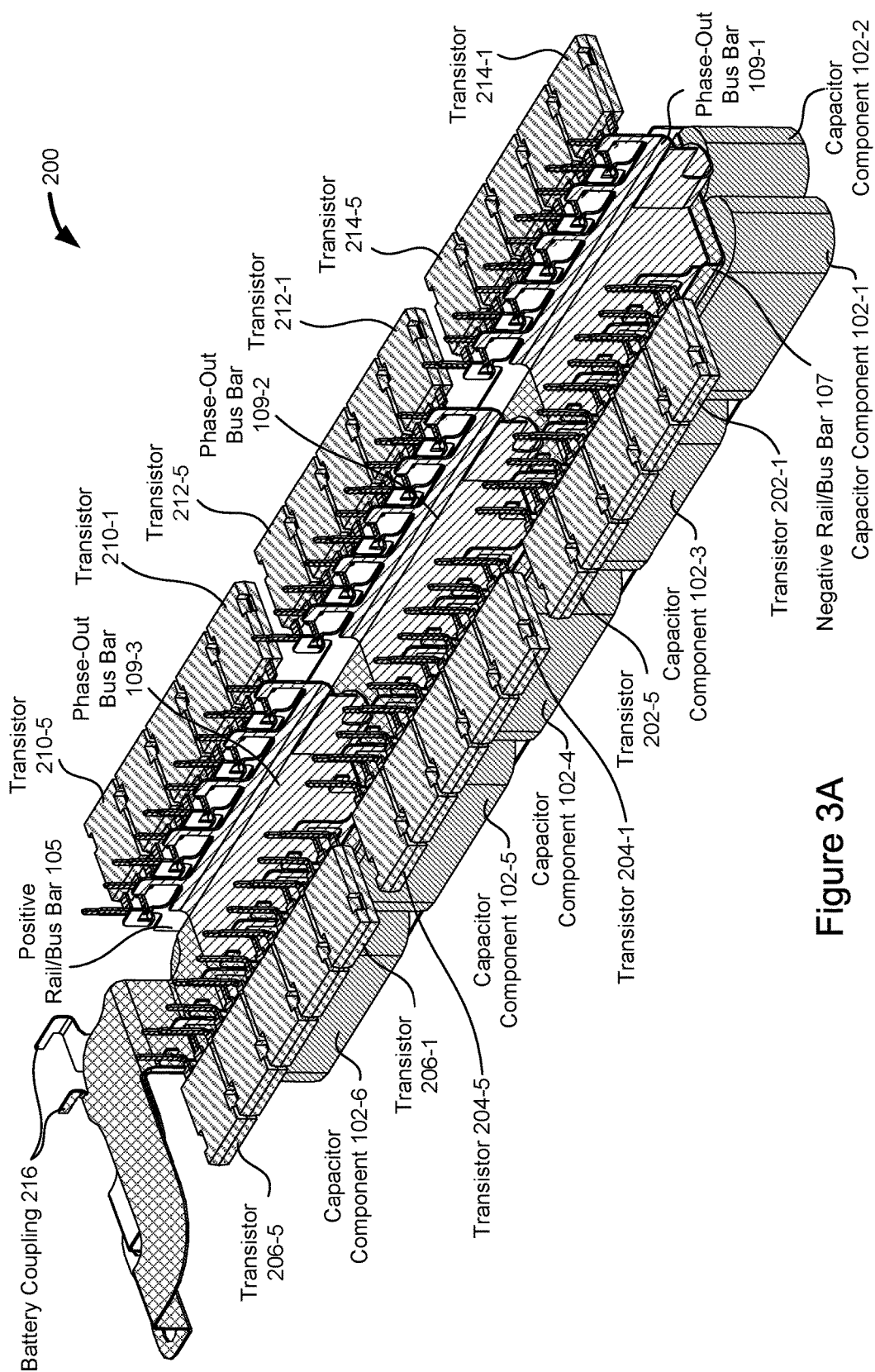
FIGS. 3A-3B are perspective diagrams illustrating components of the three-phase inverter of FIG. 2 in accordance with some implementations.
Figure 3B:
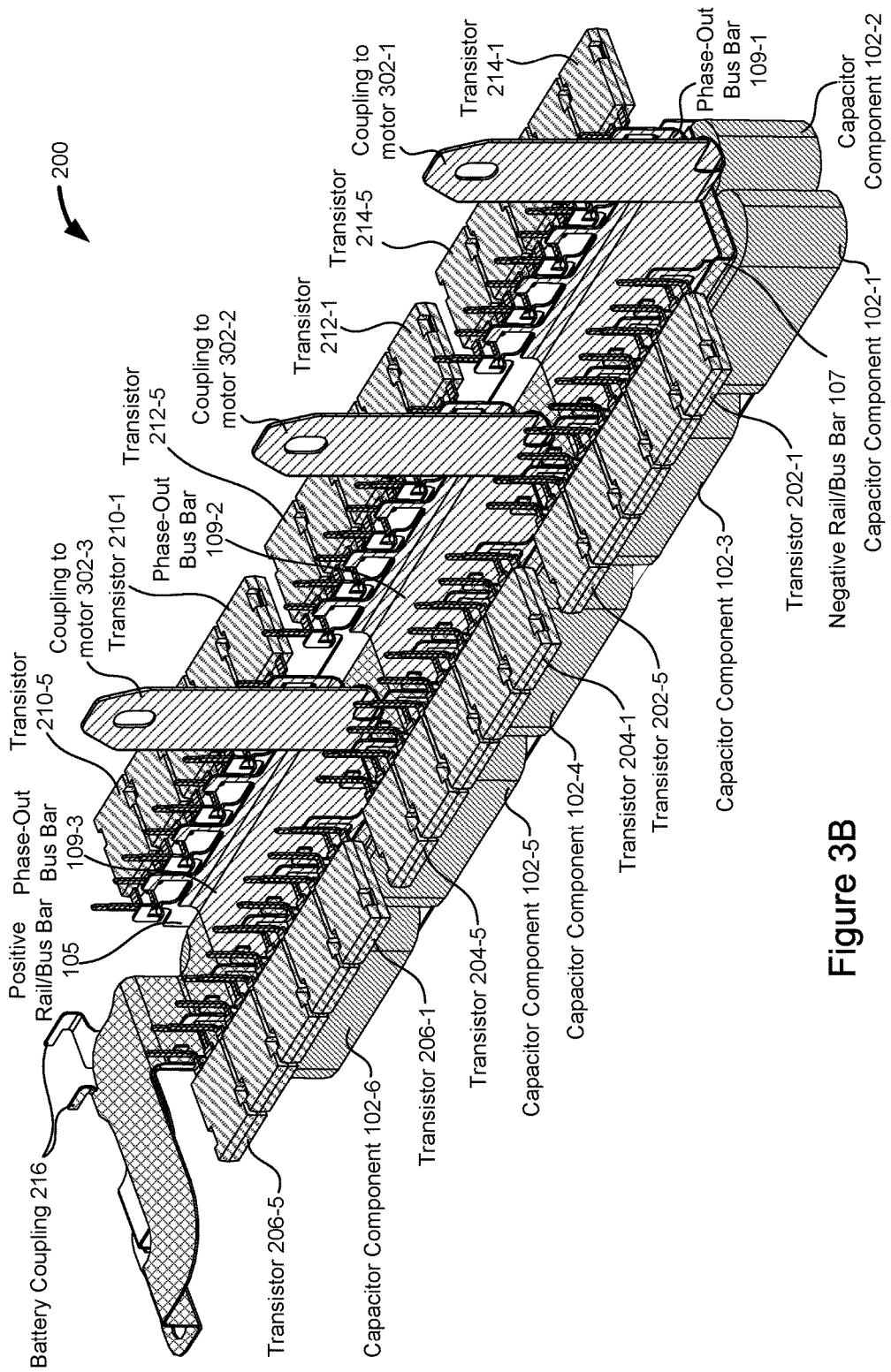

FIGS. 2, 3A-3B, 4, and 5 illustrate various views of a three-phase inverter 200, which is an example of the three-phase inverter 115 (FIG. 1B), in accordance with some implementations. FIG. 2 shows capacitor components 102-1 and 102-2 coupled to transistors 202 (e.g., 202-1 through 202-5), 204 (e.g., 204-1 through 204-5), 206 (e.g., 206-1 through 206-5) via negative rail 107 and coupled to transistors 210 (e.g., 210-1 through 210-5), 212 (e.g., 212-1 through 212-5), and 214 (e.g., 214-1 through 214-5) via positive rail 105. The negative rail 107 and positive rail 105 are implemented as respective bus bars. The transistors 202 are coupled to the transistors 214 via a phase-out bus bar 109-1, the transistors 204 are coupled to the transistors 212 via a phase-out bus bar 109-2, and the transistors 206 are coupled to the transistors 210 via a phase-out bus bar 109-3.

The transistors 202-1 through 202-5 are thus arranged in parallel between the negative rail/bus bar 107 and the phase-out bus bar 109-1. The transistors 204-1 through 204-5 are thus arranged in parallel between the negative rail/bus bar 107 and the phase-out bus bar 109-2. The transistors 206-1 through 206-5 are thus arranged in parallel between the negative rail/bus bar 107 and the phase-out bus bar 109-3. The transistors 210-1 through 210-5 are thus arranged in parallel between the positive rail/bus bar 105 and the phase-out bus bar 109-3. The transistors 212-1 through 212-5 are thus arranged in parallel between the positive rail/bus bar 105 and the phase-out bus bar 109-2. And the transistors 214-1 through 214-5 are thus arranged in parallel between the positive rail/bus bar 105 and the phase-out bus bar 109-1.

In some implementations, the transistors 202, 204, 206, 210, 212, and/or 214 are bipolar transistors (e.g., IGBTs). Alternatively, the transistors 202, 204, 206, 210, 212, and/or 214 are FETs (e.g., SiC MOSFETs or GaN FETs). The transistors 202, 204, and 206 each include three leads, with a first lead (e.g., emitter lead 504 corresponding to an emitter terminal or source-drain lead corresponding to a source/drain terminal of the transistor) coupled to the negative rail/bus bar 107, a second lead (e.g., collector lead 502 corresponding to a collector terminal or source-drain lead corresponding to a source/drain terminal of the transistor) coupled to a corresponding phase-out bus bar 109, and a third lead (e.g., gate lead 506). The transistors 210, 212, and 214 each include three leads, with a first lead (e.g., collector lead 502 corresponding to a collector terminal or source-drain lead corresponding to a source/drain terminal of the transistor) coupled to the positive rail/bus bar 105, a second lead (e.g., emitter lead 504 corresponding to an emitter terminal or source-drain lead corresponding to a source/drain terminal of the transistor) coupled to a corresponding phase-out bus bar 109, and a third lead (e.g., gate lead 506). For example, FIG. 5 shows the transistor 202-1 having a collector lead 502-1, an emitter lead 504-1, and a gate lead 506-1 and transistor 214-1 having a collector lead 502-2, an emitter lead 504-2, and a gate lead 506-2. The collector lead 502-1 of transistor 202-1 is coupled to the emitter lead 504-2 of transistor 214-1 via the phase-out bus bar 109-1 (e.g., by soldering or welding the collector lead 502-1 and emitter lead 504-2 to the phase-out bus bar 109-1), the emitter lead 504-1 of transistor 202-1 is coupled to the negative rail/bus bar 107 (e.g., soldered or welded to the negative rail/bus bar 107), and the collector lead 502-2 of transistor 214-1 is coupled to the positive rail/bus bar 105 (e.g., soldered or welded to the positive rail/bus bar 105).

In some implementations, the third lead of each transistor 202, 204, and 206 (e.g., gate lead 506 corresponding to a gate terminal of the transistor) is coupled to driver circuitry (not shown) (e.g., drivers 114, FIG. 1A). In some implementations, the third lead of each transistor 210, 212, and 214 (e.g., gate lead 506 corresponding to a gate terminal of the transistor) is coupled to driver circuitry (not shown) (e.g., drivers 112, FIG. 1A).

The positive rail/bus bar 105 and the negative rail/bus bar 107 each include a respective battery-coupling portion 216 for coupling to a battery, such as the battery 108 (FIG. 1B). The phase-out bus bars 109-1 through 109-3 each include a respective motor-coupling portion 302-1 through 302-3 (FIG. 3B) for coupling the phase-out bus bars 109 to a motor (e.g., motor 110, FIG. 1A), in accordance with some implementations.

In some implementations, the capacitor 102 has a positive terminal (e.g., at a first end) (e.g., on the bottom, or alternatively on the top, of the capacitor 102) and a negative terminal (e.g., at a second end opposite of the first end) (e.g., on the top, or alternatively the bottom, of the capacitor 102). The capacitor 102 comprises multiple capacitor components (e.g., capacitor components 102-1 through 102-6 and other capacitor components that are not visible in the drawings due to perspective) in accordance with some implementations.

As shown in FIG. 5, the positive rail/bus bar 105 is coupled to a first side (e.g., the bottom), and thus to a positive terminal, of the capacitor 102 and the negative rail/bus bar 107 is coupled to a second side (e.g., the top), and thus to a negative terminal, of the capacitor 102. In some implementations, the phase-out bus bars 109 overlay the negative rail/bus bar 107 so as to minimize an area between the phase-out bus bars 109 and the negative rail/bus bar 107. The rail/bus bars 105 and 107 and the phase-out bus bars 109 are composed of an electrically-conductive material. For example, the rails/bus bars 105 and 107 and the phase-out bus bars 109 are composed of metal (e.g., copper).

In some implementations, the areas between the rail/bus bars and the phase-out bus bars 109 shown in FIG. 5 (e.g., the area between the negative rail/bus bar 107 and the phase-out bus bar 109-1) are filled with an insulating material (e.g., a thermally and/or electrically insulating material). For example, one or more (e.g., all) of the areas are filled with an epoxy.

Although the figures show the positive rail/bus bar 105 coupled to a side of the capacitor opposite of the phase-out bus bars 109 and transistors, in some implementations, the relative positioning of the positive rail/bus bar 105 and the negative rail/bus bar 107 is reversed, such that the positive rail/bus bar 105 is coupled to a side of the capacitor closest to the phase-out bus bars 109 and the transistors (not shown).

Although the figures show sets of five parallel transistors (e.g., transistors 202-1 through 202-5 and transistors 214-1 through 214-5), in some implementations, a different number of transistors are used (e.g., 3, 4, or 6 transistors) for each set of parallel transistors. In some implementations, the inverter is configured to operate with varying numbers of transistors for different phases. For example, the inverter is configured to utilize two sets of three transistors for a first phase (e.g., corresponding to phase-out bus bar 109-1), utilize two sets of four transistors for a second phase (e.g., corresponding to phase-out bus bar 109-2), and utilize two sets of six transistors for a third phase (e.g., corresponding to phase-out bus bar 109-3). In some implementations, the inverter is configured to utilize transistors of varying size and performance.

Figure 6:
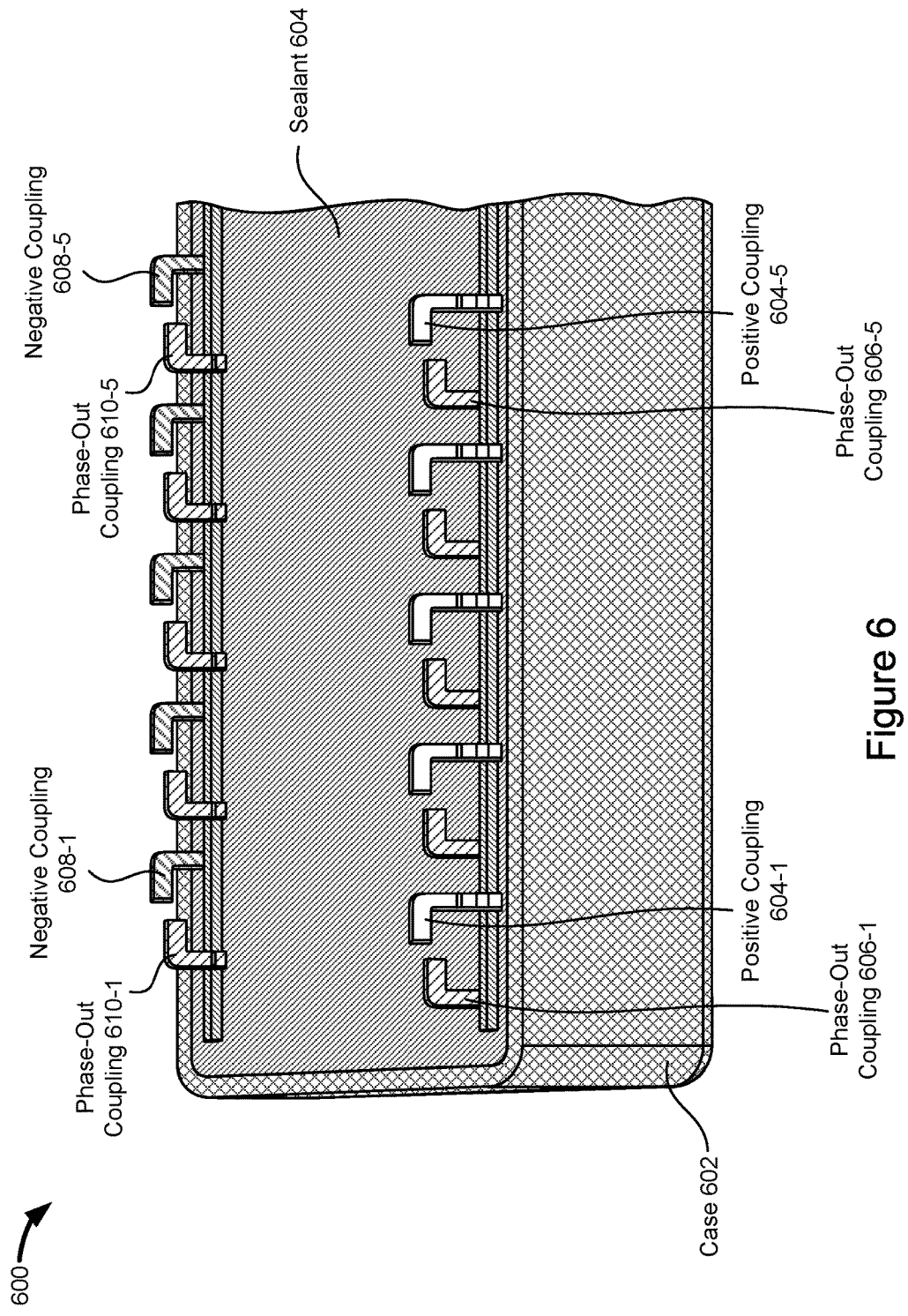
FIG. 6 is a perspective diagram illustrating components of an inverter (e.g., the three-phase inverter of FIG. 2) with encased components in accordance with some implementations.

FIG. 6 is a perspective diagram illustrating components of an inverter 600 with encased components in accordance with some implementations. The capacitor 102 and portions of the positive rail/bus bar 105, negative rail/bus bar 107, and phase-out bus bars 109 are encased in a case 602 such that coupling portions of the positive rail/bus bar 105, the negative rail/bus bar 107, and the phase-out bus bars 109 extend from the case 602. The coupling portions of the positive rail/bus bar 105 include positive couplings 604 (e.g., 604-1 through 604-5) to contact a first set of transistors (e.g., the transistors 214 in FIG. 2). The coupling portions of the negative rail/bus bar 107 include negative couplings 608 (e.g., 608-1 through 608-5) to contact a second set of transistors (e.g., the transistors 202 in FIG. 2). The coupling portions of the phase-out bus bars 109 include phase-out couplings 606 (e.g., 606-1 through 606-5 for phase-out bus bar 109-1) to contact the first set of transistors, and phase-out couplings 610 (e.g., 610-1 through 610-5 for phase-out bus bar 109-1) to contact the second set of transistors. In some implementations, battery-coupling portions of the positive rail/bus bar 105 and the negative rail/bus bar 107 (e.g., battery-coupling portions 216) extend from the case 602. In some implementations, motor-coupling portions of the phase-out bus bars 109 (e.g., motor-coupling portions 302) extend from the case 602.

In accordance with some implementations, the capacitor 102 and portions of the positive rail/bus bar 105, negative rail/bus bar 107, and phase-out bus bars 109 are enclosed in the case 602 with a sealant 604, such as epoxy. In some implementations, the case 602 is composed of a plastic or polymer. In some implementations, the case 602 is adapted to provide structural support for the inverter 600. In some implementations, the case 602 and sealant 604 are adapted to prevent moisture from contacting the capacitor 102.

Although the coupling portions shown in FIG. 6 are flag-shaped, in various implementations, the coupling portions have other geometric (e.g., rectangular) or non-geometric shapes.

In accordance with some implementations, during assembly of the inverter, the rails/bus bars 105 and 107 and phase-out bus bars 109 are first mechanically coupled with the capacitor 102 to provide a capacitor assembly. The capacitor assembly is then placed in the case 602 and the sealant 604 is applied to seal the capacitor assembly within the case 602. After sealing the case 602, the transistors 202, 204, 206, 210, 212, and 214 are coupled to respective coupling portions 604 of the positive rail/bus bar 105, coupling portions 606 and 610 of the phase-out bus bars 109, and coupling portions 608 of the negative rail/bus bar 107.

Figure 7:
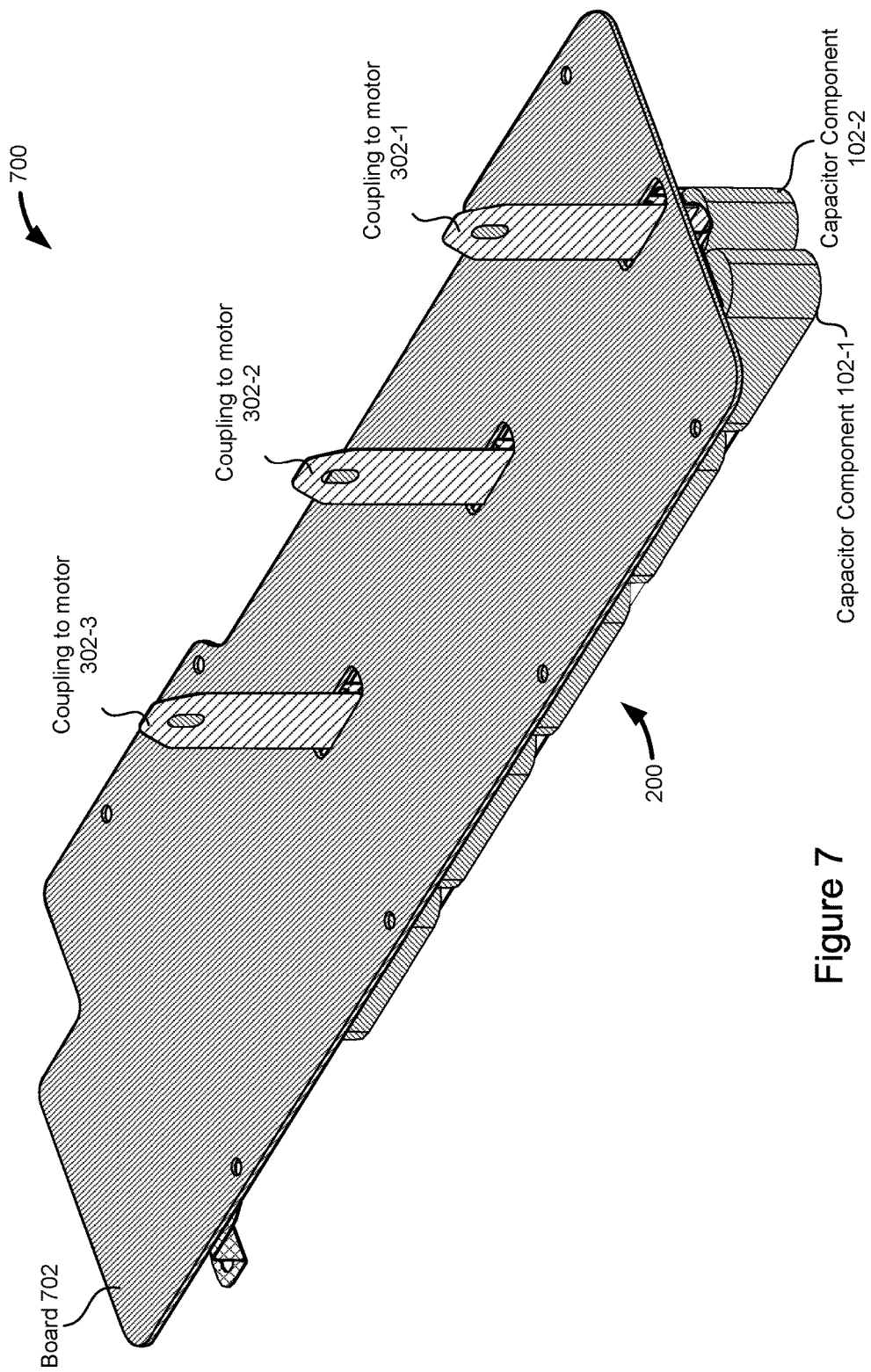
FIG. 7 is a perspective diagram illustrating components of a three-phase inverter (e.g., the three-phase inverter of FIG. 2) with an associated circuit board in accordance with some implementations.

FIG. 7 is a perspective diagram illustrating components of a three-phase inverter 700 in accordance with some implementations. FIG. 7 shows the inverter 200 coupled to a board 702. In some implementations, the board 702 comprises a printed circuit board (PCB). In some implementations, the board 702 includes circuitry, such as driver circuitry (not shown), for controlling switching of the transistors 202, 204, 206, 210, 212, and 214. In some implementations, the drivers 112 and 114 (FIG. 1A) are located on the board 702 (e.g., for each of the three phases). In some implementations, the board 702 includes distinct driver circuitry for each set of transistors 202, 204, 206, 210, 212, and 214. While the case 602 is not shown in FIG. 7, in practice the inverter 700 includes the case 602 (e.g., is an example of the inverter 600, FIG. 6).

Figure 4:
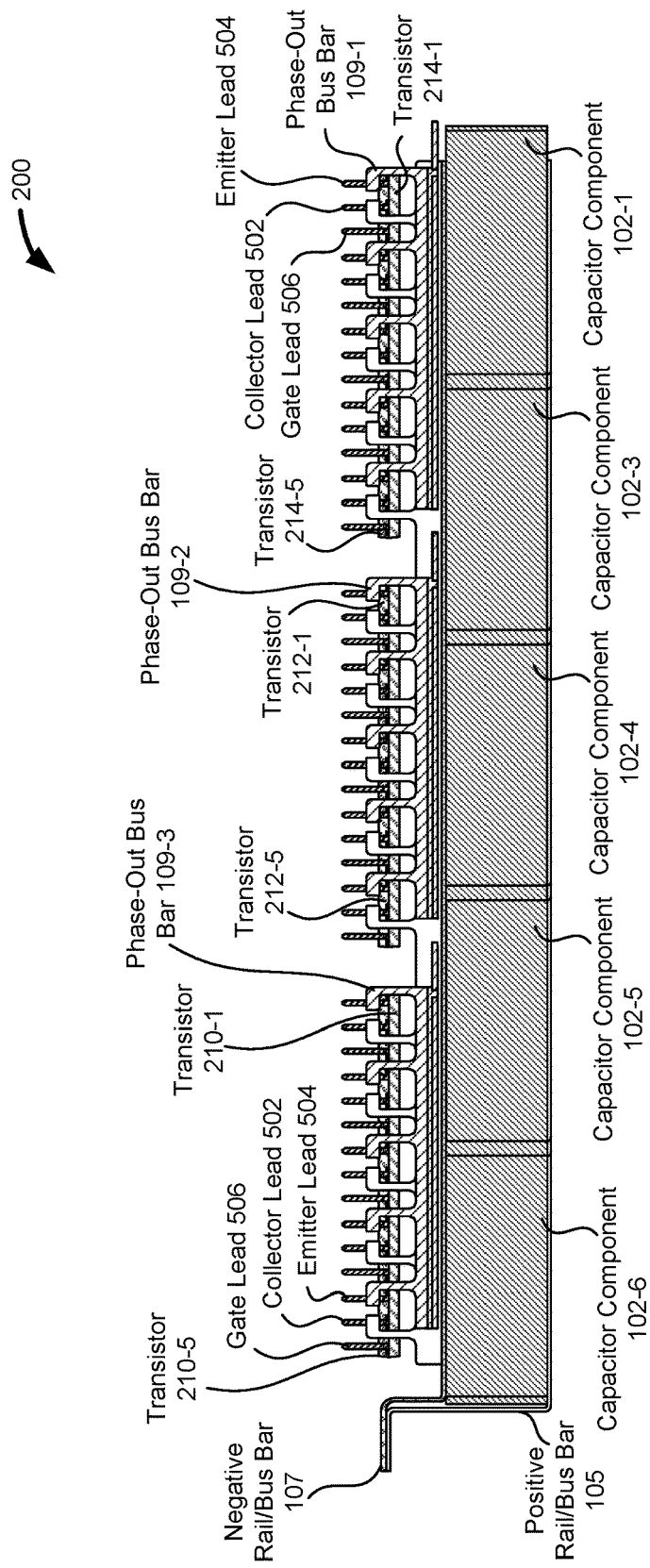
FIG. 4 illustrates a side-view of the three-phase inverter of FIG. 2 in accordance with some implementations.
Figure 8:
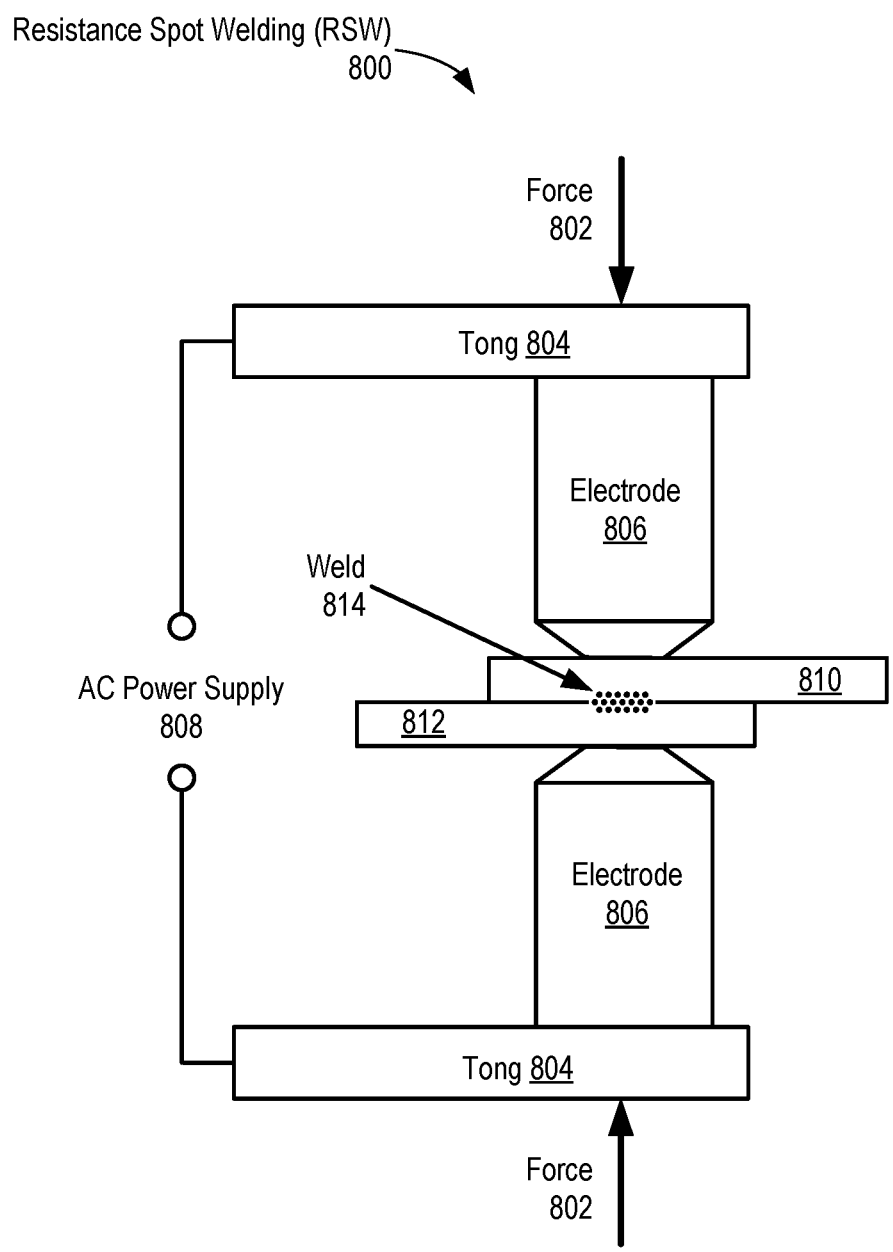
FIG. 8 is a schematic diagram illustrating resistance spot welding.

As mentioned, electrical leads (e.g., collector leads 502, emitter leads 504, and/or gate leads 506, FIGS. 4-5) may be welded to respective electrical couplings (e.g., positive couplings 604, negative couplings 608, and/or phase-out couplings 606 and 610, FIG. 6). FIG. 8 is a schematic diagram illustrating resistance spot welding (RSW) 800, which is used to weld leads to couplings in accordance with some embodiments. A weld joint 814 is formed between a first conductive element 810 (e.g., a lead) and a second conductive element 812 (e.g., a coupling). To form the weld joint 814, electrodes 806 are placed in contact with the conductive elements 810 and 812. The electrodes 806 and conductive elements 810 and 812 are sandwiched between tongs 804. Force 802 is applied to the tongs 804, thereby pushing together the conductive elements 810 and 812. While the force 802 is applied, an AC power supply 808 supplies power to the electrodes 806, resulting in formation of the weld joint 814.

Improper alignment of the conductive elements 810 and 812 can degrade the quality of the weld joint 814 or even result in failure to form a weld joint 814, particularly if the conductive elements 810 and 812 have similar dimensions. For example, an offset between the conductive elements 810 and 812 (e.g., in a plane perpendicular to the page in FIG. 8), such that the conductive elements 810 and 812 only partially overlap at the point where the weld joint 814 is to be formed, can result in a poor or nonexistent weld joint 814.

In FIGS. 2-6, the electrical couplings have substantially rectangular flag-shaped end sections (e.g., rectangular to within manufacturing tolerances, and with rounded corners) with widths that are wider than the widths of the transistor leads. The result is a substantially constant overlap area for the weld joint (e.g., constant to within manufacturing tolerances for the dimensions of the flag-shaped endings). The location of a transistor lead can shift without affecting the overlap area, and thus without affecting the quality of the weld joint, as long as the transistor lead remains within the boundaries of the respective end section of the coupling to which it is to be welded.

Figure 9:
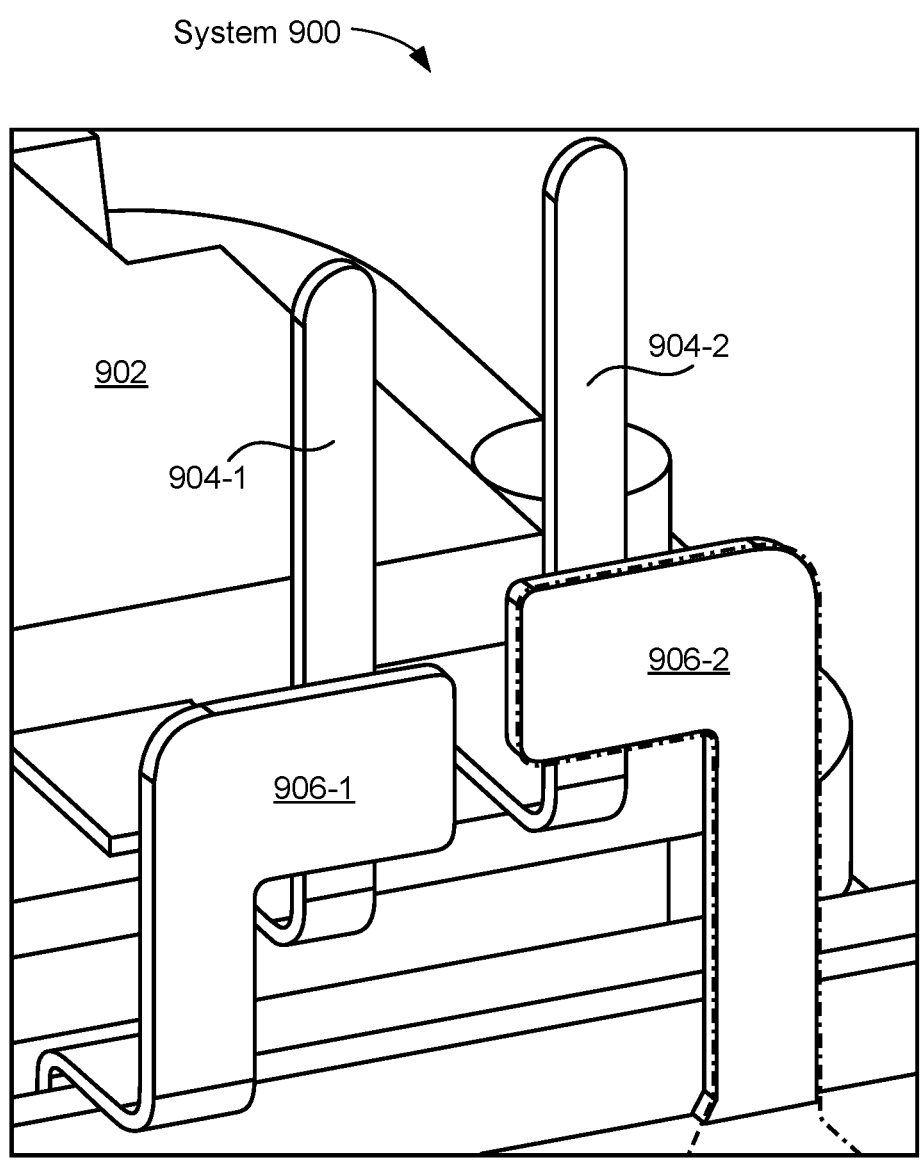
FIG. 9 is a perspective diagram showing a portion of an electronic system in which electrical leads are welded to electrical couplings with substantially rectangular end sections, in accordance with some embodiments.

FIG. 9, which shows a portion of an electronic system 900 in accordance with some embodiments, illustrates this principle. The electronic system 900 may be a high-voltage system (e.g., an inverter, such as the inverter 200/600). A packaged semiconductor device 902 has leads 904-1 and 904-2. The packaged semiconductor device 902 may be a discrete transistor (e.g., one of the transistors 202, 204, 206, 210, 212, or 214, FIGS. 2-5) or an integrated circuit. The leads 904-1 and 904-2 are welded to respective electrical couplings 906-1 and 906-2, which have substantially rectangular flag-shaped end sections. The leads 904-1 and 904-2 extend in a direction that is substantially perpendicular (e.g., to within manufacturing tolerances) to the widths of the end sections of the electrical couplings 906-1 and 906-2. The location of the leads 904-1 and 904-2 within the boundaries of the end sections of their respective electrical couplings 906-1 and 906-2 can vary without affecting the overlap area for the weld joints. In one example, one of the electrical couplings 906-1 or 906-2 is a phase-out coupling 606 (FIG. 6) of a phase-out bus bar 109 (FIGS. 4-5) and the other is a positive coupling 604 (FIG. 6) of a positive rail/bus bar 105 (FIGS. 4-5). In another example, one of the electrical couplings 906-1 or 906-2 is a phase-out coupling 610 (FIG. 6) of a phase-out bus bar 109 (FIGS. 4-5) and the other is a negative coupling 608 (FIG. 6) of a negative rail/bus bar 107 (FIGS. 4-5). Still other examples are possible (e.g., for a different inverter configuration or for a type of electronic system 900 other than an inverter).

Figure 10:
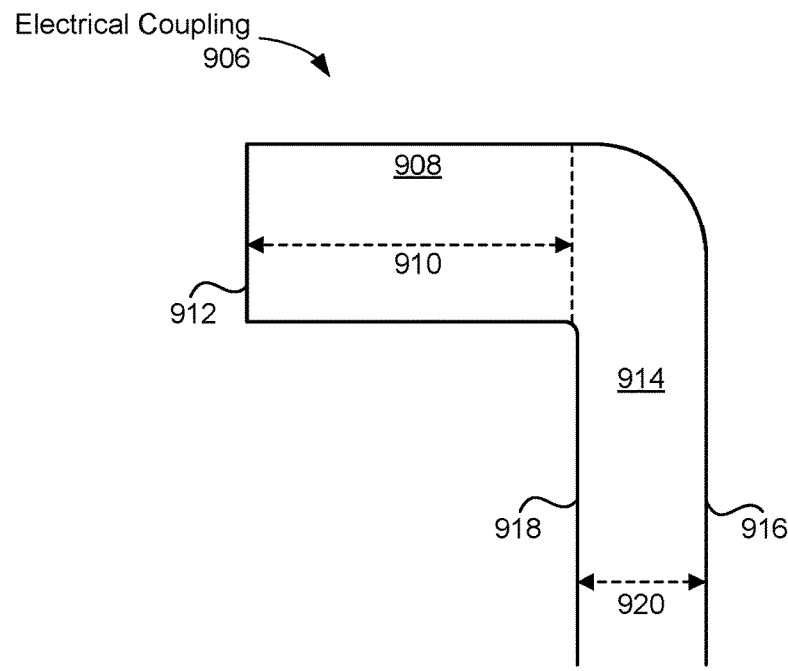
FIG. 10 shows an electrical coupling in the electronic system of FIG. 9 in accordance with some embodiments.

FIG. 10 shows an electrical coupling 906 (e.g., coupling 906-1 or 906-2, FIG. 9) in accordance with some embodiments. The coupling 906 includes an end section 908 and a support 914. The end section 908 is substantially rectangular but may have one or more rounded corners (i.e., all or a portion of the corners are rounded). The width 910 of the end section 908 is greater than the width of the leads 904-1 and 904-2 (FIG. 9). The support 914 connects to an electrical bus (e.g., positive rail/bus bar 105, negative rail/bus bar 107, or a phase-out bus bar 109) or other conductor, and thus electrically couples the end section 908 to the electrical bus or other conductor. The support 914 therefore may extend from a conductive sheet sealed in the case 602 to the end section 908 (e.g., from the conductive sheet of the positive rail/bus bar 105, negative rail/bus bar 107, or a phase-out bus bar 109 to the end section 908). The end section 908 and support 914 may be considered part of the electrical bus or other conductor.

A side 912 of the end section 908 corresponds to the height of the end section. A side 916 of the support 914 is substantially parallel to the side 912 (e.g., to within manufacturing tolerances, and ignoring the rounded corner) and forms a side of the electrical coupling 906. Another side 918 of the support 914 is also substantially parallel to the side 912. In some embodiments, the width 910 is greater than the width 920 of the support 914.

In the example of FIG. 9, the two electrical couplings 906-1 and 906-2 have end sections 908 (FIG. 10) that extend away from their respective supports 914 (FIG. 10) toward each other. The end section 908 of the coupling 906-1 thus extends away from the support 914 of the coupling 906-1 toward the coupling 906-2. Similarly, the end section 908 of the coupling 906-2 extends away from the support 914 of the coupling 906-2 toward the coupling 906-1. This mirror-like configuration provides wide separation between the supports 914 of the couplings 906-1 and 906-2, which is desirable for high-voltage applications.

Figure 11:
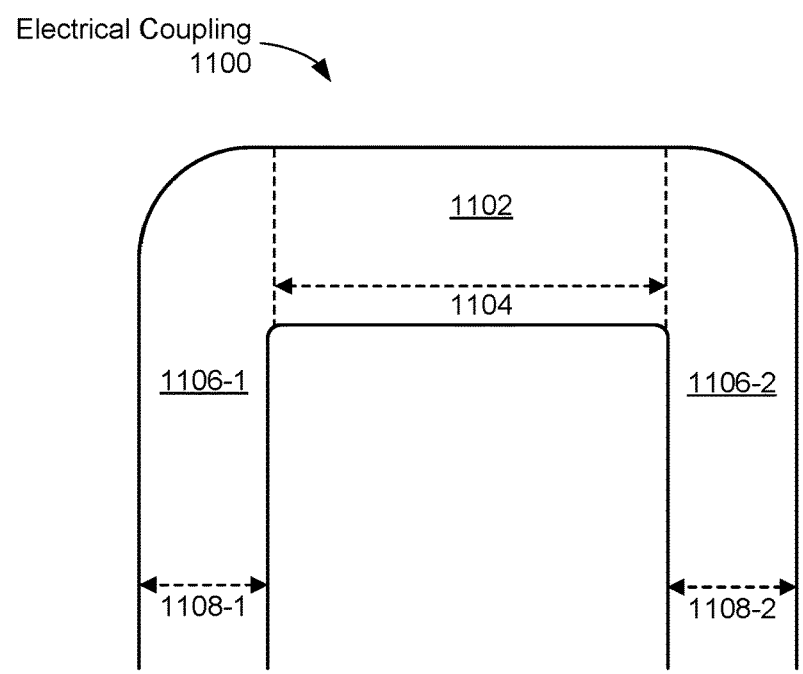
FIG. 11 shows an electrical coupling with two supports supporting an end section, in accordance with some embodiments.

In some embodiments, the end section of an electrical coupling to which a respective lead is to be welded is supported by two supports. FIG. 11 shows an example of such an electrical coupling 1100, in accordance with some embodiments. A substantially rectangular end section 1102 (e.g., with one or more rounded corners) is supported by two supports 1106-1 and 1106-2. The supports 1106-1 and 1106-2 may connect to opposite sides of the end section 1102. The width 1104 of the end section 1102 is greater than the width of the corresponding lead. In some embodiments, the widths 1108-1 and 1108-2 (which may or may not be substantially equal) of the supports 1106-1 and 1106-2 are both less than the width 1104. The supports 1106-1 and 1106-2 connect to an electrical bus (e.g., positive rail/bus bar 105, negative rail/bus bar 107, or a phase-out bus bar 109) or other conductor, and thus electrically couple the end section 1102 to the electrical bus or other conductor. The supports 1106-1 and 1106-2 therefore may extend from a conductive sheet sealed in the case 602 to the end section 1102 (e.g., from the conductive sheet of the positive rail/bus bar 105, negative rail/bus bar 107, or a phase-out bus bar 109 to the end section 1102). The end section 1102 and supports 1106-1 and 1106-2 may be considered part of the electrical bus or other conductor.

Figure 12:
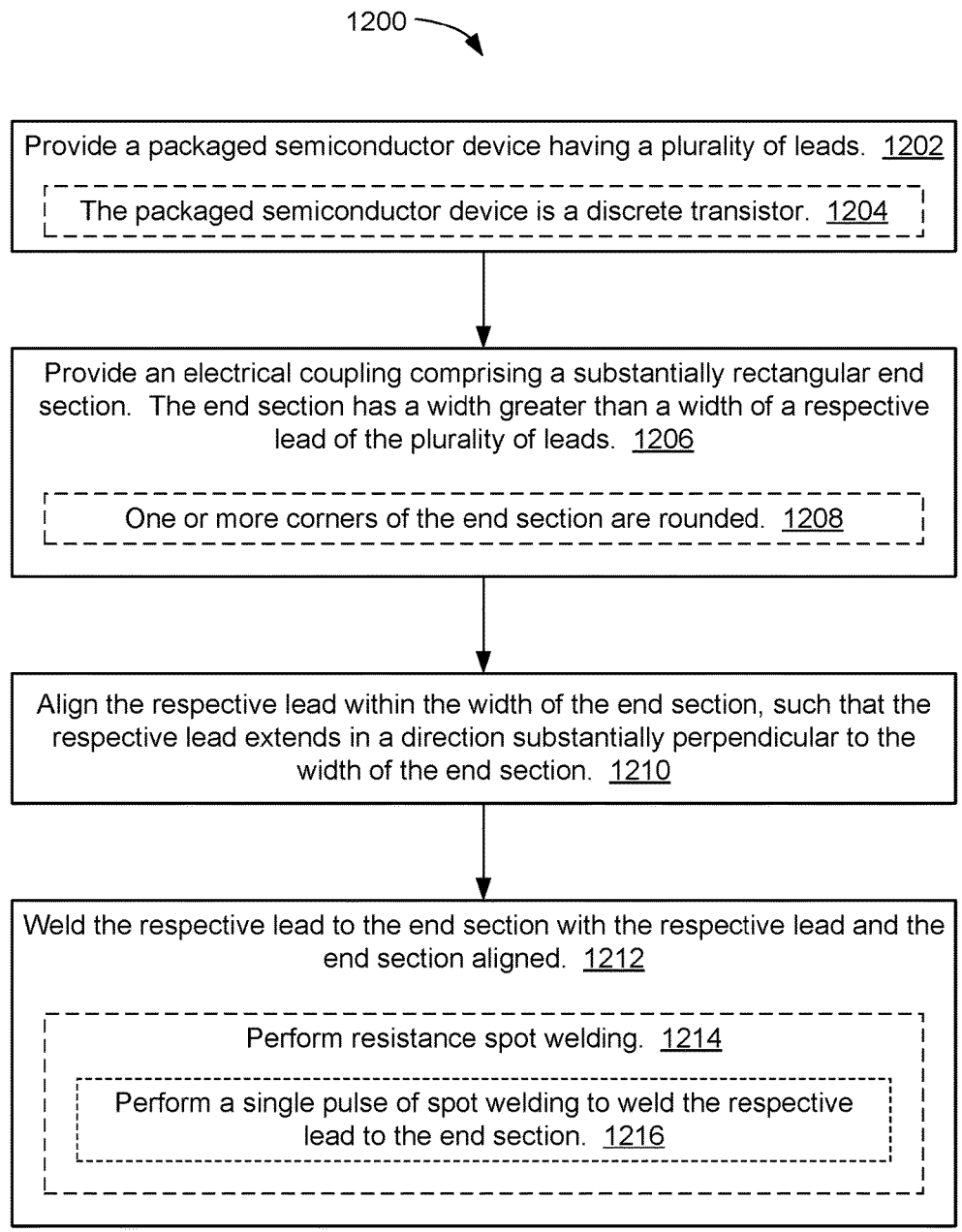
FIG. 12 is a flowchart showing a welding method in accordance with some embodiments.

FIG. 12 is a flowchart showing a welding method 1200 in accordance with some embodiments. In the method 1200, a packaged semiconductor device (e.g., device 902, FIG. 9) is provided (1202) that has a plurality of leads (e.g., including leads 904-1 and 904-2, FIG. 9) (e.g., collector lead 502, emitter lead 504, and gate lead 506, FIGS. 4-5). In some embodiments, the packaged semiconductor device is (1204) a discrete transistor (e.g., one of the transistors 202, 204, 206, 210, 212, or 214, FIGS. 2-5). Alternatively, the packaged semiconductor device is an integrated circuit. An electrical coupling (e.g., a positive coupling 604, negative coupling 608, or phase-out coupling 606 or 610, FIG. 6) (e.g., electrical coupling 906, FIGS. 9-10; electrical coupling 1100, FIG. 11) with a substantially rectangular end section is also provided (1206). The end section (e.g., end section 908, FIG. 10; end section 1102, FIG. 11) has a width greater than a width of a respective lead of the plurality of leads. In some embodiments, one or more (e.g., all) corners of the end section are rounded (1208).

The respective lead is aligned (1210) within the width of the end section, such that the respective lead extends in a direction substantially perpendicular to the width of the end section. Examples of this alignment are shown in FIG. 9.

With the respective lead and the end section aligned, the respective lead is welded (1212) to the end section. In some embodiments, resistance spot welding (e.g., RSW 800, FIG. 8) is performed (1214). For example, a single pulse of spot welding is performed (1216) to weld the respective lead to the end section. The constant overlap area for the weld, as provided by the geometry of the electrical coupling, allows for single-pulse spot welding because no initial calibration pulse need be performed to estimate the overlap. Manufacturing is thereby simplified.

In some embodiments, the method 1200 is performed repeatedly for multiple pairs of leads and electrical couplings. For example, the method 1200 is performed for both electrical couplings 906-1, 906-2 and corresponding leads 904-1, 904-2 in the electronic system 900 (FIG. 9). The method 1200 may be performed for every pair of coupling and lead in the inverter 200/600, or in other electronic (e.g., high-voltage) systems.

The method 1200 thus provides a reliable, efficient technique for performing welding in the assembly of electronic systems. The constant weld-joint overlap area provided by the method 1200 ensures the formation of repeatable, high-quality weld joints.

Certain implementations of power inverters are now described.

In accordance with some implementations, an inverter includes: (1) a case (e.g., the case 602); (2) a capacitor situated in the case (e.g., the capacitor 102), the capacitor having a first terminal and a second terminal; (3) a first transistor external to the case (e.g., the transistor 214-1, or alternatively the transistor 202-1) and coupled to the first terminal of the capacitor; (4) a second transistor external to the case (e.g., the transistor 202-1, or alternatively the transistor 214-1) and coupled between the first transistor and the second terminal of the capacitor; (5) a first bus bar (e.g., the positive rail/bus bar 105, or alternatively the negative rail/bus bar 107) to connect the first terminal of the capacitor to the first transistor, the first bus bar comprising a first portion situated in the case and a second portion extending from the case to contact the first transistor (e.g., the positive coupling 604-1, or alternatively the negative coupling 608-

1); (6) a second bus bar (e.g., the negative rail/bus bar 107, or alternatively the positive rail/bus bar 105) to connect the second terminal of the capacitor to the second transistor, the second bus bar comprising a first portion situated in the case and a second portion extending from the case to contact the second transistor (e.g., the negative coupling 608-1, or alternatively the positive coupling 604-1); and (7) a phase-out bus bar (e.g., the phase-out bus bar 109-1) to connect the first transistor to the second transistor, the phase-out bus bar comprising a first portion situated in the case, a second portion extending from the case to contact the first transistor (e.g., the phase-out coupling 606-1, or alternatively the phase-out coupling 610-1), and a third portion extending from the case to contact the second transistor (e.g., the phase-out coupling 610-1, or alternatively the phase-out coupling 606-1).

In some implementations, the first portion of the phase-out bus bar comprises a conductive sheet (e.g., composed of metal) situated above the capacitor in the case. For example, FIG. 2 shows each phase-out bus bar 109 having a portion comprising a conductive sheet situated above the capacitor 102. In some implementations, the first portion of the phase-out bus bar comprises a conductive sheet situated below, or to a side of, the capacitor in the case.

In some implementations: (1) the first terminal of the capacitor is on the bottom of the capacitor; (2) the first portion of the first bus bar comprises a conductive sheet situated below the capacitor in the case; (3) the second terminal of the capacitor is on the top of the capacitor; and (4) the first portion of the second bus bar comprises a conductive sheet situated above the capacitor and below the first portion of the phase-out bus bar in the case. For example, FIGS. 4 and 5 show the positive rail/bus bar 105 coupled to a bottom of the capacitor 102 and comprising a conductive sheet situated below the capacitor. FIGS. 4 and 5 also show the negative rail/bus bar 107 coupled to a top of the capacitor 102 and comprising a conductive sheet that is situated above the capacitor and below a conductive sheet that is a portion of the phase-out bus bar 109-1.

In some implementations, the first terminal of the capacitor is a positive terminal and the second terminal of the capacitor is a negative terminal. For example, FIG. 5 shows the bottom terminal (e.g., the first terminal) of the capacitor 102 coupled to the positive rail/bus bar 105 and the top terminal (e.g., the second terminal) of the capacitor 102 coupled to the negative rail/bus bar 107.

In some implementations, the case is sealed. The capacitor and the first portions of the first bus bar, second bus bar, and phase-out bus bar are sealed in the case. In some implementations, the case is sealed with epoxy. For example, FIG. 6 shows the case 602 sealed with sealant 604 with the coupling portions of the positive rail/bus bar 105, negative rail/bus bar 107, and phase-out bus bar 109 extending outside of the sealed case 602 and the other portions of the positive rail/bus bar 105, negative rail/bus bar 107, and phase-out bus bar 109 sealed within the case 602.

In some implementations: (1) the first and second transistors are insulated-gate bipolar transistors, each comprising an emitter, a collector, and a gate; (2) the collector of the first transistor is coupled to the first terminal of the capacitor via the first bus bar; (3) the emitter of the first transistor is coupled to the collector of the second transistor via the phase-out bus bar; and (4) the emitter of the second transistor is coupled to the second terminal of the capacitor via the second bus bar. For example, FIG. 5 shows the collector lead 502-2 of the transistor 214-1 coupled to the positive rail/bus bar 105, the collector lead 502-1 of the transistor 202-1 coupled to the emitter lead 504-2 of the transistor 214-1 via the phase-out bus bar 109-1, and the emitter lead 504-1 of the transistor 202-1 coupled to the negative rail/bus bar 107.

In some implementations: (1) the first and second transistors are silicon-carbide metal-oxide-semiconductor field-effect transistors (SiC MOSFETs) or gallium-nitride field-effect transistors (GaN FETs), each comprising a first source/drain terminal, a second source/drain terminal, and a gate; (2) the first source/drain terminal of the first transistor is coupled to the first terminal of the capacitor via the first bus bar; (3) the second source/drain terminal of the first transistor is coupled to the first source/drain terminal of the second transistor via the phase-out bus bar; and (4) the second source/drain terminal of the second transistor is coupled to the second terminal of the capacitor via the second bus bar.

In some implementations, the phase-out bus bar is a first phase-out bus bar (e.g., the phase-out bus bar 109-1) to provide a first phase of alternating current. The inverter further includes: (1) a third transistor external to the case (e.g., the transistor 212-1, or alternatively the transistor 204-1) and coupled to the first terminal of the capacitor; (2) a fourth transistor external to the case (e.g., the transistor 204-1, or alternatively the transistor 212-1) and coupled between the third transistor and the second terminal of the capacitor; and (3) a second phase-out bus bar (e.g., the phase-out bus bar 109-2), distinct from the second bus bar, to connect the third transistor to the fourth transistor and to provide a second phase of alternating current. The second phase-out bus bar comprises a first portion situated in the case, a second portion extending from the case to contact the third transistor, and a third portion extending from the case to contact the fourth transistor.

In some implementations, the inverter further includes: (1) a fifth transistor external to the case (e.g., the transistor 210-1, or alternatively the transistor 206-1) and coupled to the first terminal of the capacitor; (2) a sixth transistor external to the case (e.g., the transistor 206-1, or alternatively the transistor 210-1) and coupled between the fifth transistor and the second terminal of the capacitor; and (3) a third phase-out bus bar (e.g., the phase-out bus bar 109-3) to connect the fifth transistor to the sixth transistor and to provide a third phase of alternating current. The third phase-out bus bar comprises a first portion situated in the case, a second portion extending from the case to contact the fifth transistor, and a third portion extending from the case to contact the sixth transistor.

In some implementations, the first portions of the first, second, and third phase-out bus bars comprise respective first, second, and third conductive sheets situated above the capacitor in the case and arranged in a line. For example, FIG. 2 shows the phase-out bus bars 109-1, 109-2, and 109-3 each having a sheet portion situated above the capacitor 102 and arranged in a line.

In some implementations: (1) the first terminal of the capacitor is on the bottom of the capacitor; (2) the first portion of the first bus bar comprises a conductive sheet situated below the capacitor in the case; (3) the second terminal of the capacitor is on the top of the capacitor; and (4) the first portion of the second bus bar comprises a conductive sheet situated above the capacitor and below the first, second, and third conductive sheets. For example, FIGS. 4 and 5 shows the positive rail/bus bar 105 coupling to a bottom of the capacitor 102 and comprising a conductive sheet below the capacitor 102, the negative rail/bus bar 107 coupling to a top of the capacitor 102 and comprising a conductive sheet above the capacitor 102, and the conductive sheets of the phase-out bus bars 109 situated above the conductive sheet of the negative rail/bus bar 107.

In some implementations: (1) the first transistor is one of a first plurality of transistors (e.g., the transistors 214-1 through 214-5, or alternatively the transistors 202-1 through 202-5) coupled to the first terminal of the capacitor, the first plurality of transistors being external to the case; (2) the second transistor is one of a second plurality of transistors (e.g., the transistors 202-1 through 202-5, or alternatively the transistors 214-1 through 214-5) coupled between the first plurality of transistors and the second terminal of the capacitor, the second plurality of transistors being external to the case; (3) the first bus bar connects the first terminal of the capacitor to the first plurality of transistors and comprises a plurality of portions (e.g., the positive couplings 604-1 through 604-5, or alternatively the negative couplings 608-1 through 608-5) extending from the case to contact respective transistors of the first plurality of transistors; (4) the second bus bar connects the second terminal of the capacitor to the second plurality of transistors and comprises a plurality of portions (e.g., the negative couplings 608-1 through 608-5, or alternatively the positive couplings 604-1 through 604-5) extending from the case to contact respective transistors of the second plurality of transistors; and (5) the phase-out bus bar connects the first plurality of transistors to the second plurality of transistors and comprises a first plurality of portions (e.g., the phase-out couplings 604-1 through 604-5, or alternatively the phase-out couplings 610-1 through 610-5) extending from the case to contact respective transistors of the first plurality of transistors and a second plurality of portions (e.g., the phase-out couplings 610-1 through 610-5, or alternatively the phase-out couplings 604-1 through 604-5) extending from the case to contact respective transistors of the second plurality of transistors.

In some implementations, each transistor of the first and second pluralities of transistors is a discrete transistor with its own package. For example, FIG. 2 shows each transistor 202 and each transistor 214 as discrete transistors with discrete packaging. Each transistor 204, 206, 210, and 210 may also be a discrete transistor with discrete packaging.

In some implementations, the phase-out bus-bar is a first phase-out bus bar to provide a first phase of alternating current, and the inverter further includes: (1) a third plurality of transistors (e.g., the transistors 212-1 through 212-5, or alternatively the transistors 204-1 through 204-5) coupled to the first terminal of the capacitor, the third plurality of transistors being external to the case; (2) a fourth plurality of transistors (e.g., the transistors 204-1 through 204-5, or alternatively the transistors 212-1 through 212-5) coupled between the third plurality of transistors and the second terminal of the capacitor, the fourth plurality of transistors being external to the case; (3) a second phase-out bus bar (e.g., phase-out bus bar 109-2) to connect the third plurality of transistors to the fourth plurality of transistors and to provide a second phase of alternating current, the second phase-out bus bar comprising a portion situated in the case and a plurality of portions extending from the case to contact respective transistors of the third and fourth pluralities of transistors; (4) a fifth plurality of transistors (e.g., the transistors 210-1 through 210-5, or alternatively the transistors 206-1 through 206-5) coupled to the first terminal of the capacitor, the fifth plurality of transistors being external to the case; (5) a sixth plurality of transistors (e.g., the transistors 206-1 through 206-5, or alternatively the transistors 210-1 through 210-5) coupled between the fifth plurality of transistors and the second terminal of the capacitor, the sixth plurality of transistors being external to the case; and (6) a third phase-out bus bar (e.g., the phase-out bus bar 109-3) to connect the fifth plurality of transistors to the sixth plurality of transistors and to provide a third phase of alternating current, the third phase-out bus bar comprising a portion situated in the case and a plurality of portions extending from the case to contact respective transistors of the fifth and sixth pluralities of transistors. The first bus bar connects the first terminal of the capacitor to the third and fifth pluralities of transistors and comprises a plurality of portions extending from the case to contact respective transistors of the third and fifth pluralities of transistors. The second bus bar connects the second terminal of the capacitor to the fourth and sixth pluralities of transistors and comprises a plurality of portions extending from the case to contact respective transistors of the fourth and sixth pluralities of transistors.

In accordance with some implementations, a three-phase inverter includes: (1) a sealed case (e.g., the case 602); (2) a capacitor sealed in the case (e.g., the capacitor 102), the capacitor having a first terminal and a second terminal; (3) first, second, third, fourth, fifth and sixth pluralities of transistors (e.g., the transistors 202, 204, 206, 210, 212, and 214) external to the case, where: (a) the first, third, and fifth pluralities of transistors are coupled to the first terminal of the capacitor (e.g., the transistors 214, 212, and 210, or alternatively the transistors 202, 204, and 206); and (b) the second, fourth, and sixth pluralities of transistors (e.g., the transistors 202, 204, and 206, or alternatively the transistors 214, 212, and 210) are coupled to the second terminal of the capacitor; (4) a first bus bar (e.g., the positive rail/bus bar 105, or alternatively the negative rail/bus bar 107) to connect the first terminal of the capacitor to the first, third, and fifth pluralities of transistors, the first bus bar comprising a first portion sealed in the case and respective portions extending from the case to contact respective transistors of the first, third, and fifth pluralities of transistors; (5) a second bus bar (e.g., the negative rail/bus bar 107, or alternatively the positive rail/bus bar 105) to connect the second terminal of the capacitor to the second, fourth, and sixth pluralities of transistors, the second bus bar comprising a first portion sealed in the case and respective portions extending from the case to contact respective transistors of the second, fourth, and sixth pluralities of transistors; (6) a first phase-out bus bar (e.g., the phase-out bus bar 109-1) to connect the first plurality of transistors to the second plurality of transistors and to provide a first phase of alternating current, the first phase-out bus bar comprising a portion sealed in the case and respective portions extending from the case to contact respective transistors of the first and second pluralities of transistors; (7) a second phase-out bus bar (e.g., the phase-out bus bar 109-2) to connect the third plurality of transistors to the fourth plurality of transistors and to provide a second phase of alternating current, the second phase-out bus bar comprising a portion sealed in the case and respective portions extending from the case to contact respective transistors of the third and fourth pluralities of transistors; and (8) a third phase-out bus bar (e.g., the phase-out bus bar 109-3) to connect the fifth plurality of transistors to the sixth plurality of transistors and to provide a third phase of alternating current, the third phase-out bus bar comprising a portion sealed in the case and respective portions extending from the case to contact respective transistors of the fifth and sixth pluralities of transistors.

It will also be understood that, although the terms first, second, etc. are, in some instances, used herein to describe various elements, these elements should not be limited by these terms. These terms are only used to distinguish one element from another. For example, a first transistor could be termed a second transistor, and, similarly, a second transistor could be termed a first transistor, without departing from the scope of the various described implementations. The first transistor and the second transistor are both transistors, but they are not the same transistor unless explicitly stated as such.

The terminology used in the description of the various described implementations herein is for the purpose of describing particular implementations only and is not intended to be limiting. As used in the description of the various described implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" is, optionally, construed to mean "when" or "upon" or "in response to determining" or "in response to detecting" or "in accordance with a determination that," depending on the context. Similarly, the phrase "if it is determined" or "if [a stated condition or event] is detected" is, optionally, construed to mean "upon determining" or "in response to determining" or "upon detecting [the stated condition or event]" or "in response to detecting [the stated condition or event]" or "in accordance with a determination that [a stated condition or event] is detected," depending on the context.

The foregoing description, for purpose of explanation, has been described with reference to specific implementations. However, the illustrative discussions above are not intended to be exhaustive or to limit the scope of the claims to the precise forms disclosed. Many modifications and variations are possible in view of the above teachings. The implementations were chosen in order to best explain the principles underlying the claims and their practical applications, to thereby enable others skilled in the art to best use the implementations with various modifications as are suited to the particular uses contemplated.

What is claimed is:

1. A method, comprising:
   providing a packaged semiconductor device having a plurality of leads;
   providing an electrical coupling comprising:
      a substantially rectangular end section, the end section having a width greater than a width of a respective lead of the plurality of leads;
      a support to electrically couple the end section to an electrical bus, wherein the support joins the end section such that:
         a side of the support is substantially parallel to a side of the end section that corresponds to the height of the end section; and
         the support has a narrower width than the width of the end section;
   aligning the respective lead within the width of the end section, wherein the respective lead extends in a direction substantially perpendicular to the width of the end section; and with the respective lead and the end section aligned, welding the respective lead to the end section.

2. The method of claim 1, wherein welding the respective lead to the end section comprises performing resistance spot welding.

3. The method of claim 2, wherein a single pulse of resistance spot welding is performed to weld the respective lead to the end section.

4. The method of claim 1, wherein the packaged semiconductor device is a discrete transistor.

5. The method of claim 1, wherein one or more corners of the end section are rounded.

6. The method of claim 1, wherein the electrical coupling is a first electrical coupling, the end section is a first end section, the support is a first support, and the respective lead is a first lead, the method further comprising:
providing a second electrical coupling adjacent to the first electrical coupling, the second electrical coupling comprising a second substantially rectangular end section and a second support, wherein:
the second end section has a width greater than a width of a second lead of the plurality of leads,
a side of the second support is substantially parallel to a side of the second end section that corresponds to the height of the second end section;
the second end section extends away from the second support toward the first electrical coupling; and
the first end section extends away from the first support toward the second electrical coupling;
aligning the second lead within the width of the second end section, wherein the second lead extends in a direction substantially perpendicular to the width of the second end section; and
with the second lead and the second end section aligned, welding the second lead to the second end section.

7. The method of claim 1, wherein:
the electrical bus is a positive or negative bus bar of an inverter, the positive or negative bus bar being connected to a respective terminal of a capacitor of the inverter;
the positive or negative bus bar comprises a conductive sheet sealed in a case;
the end section and the packaged semiconductor device are external to the case; and
the support extends from the conductive sheet, out of the sealed case, to the end section.

8. The method of claim 1, wherein:
the electrical bus is a phase-out bus bar of an inverter;
the phase-out bus bar comprises a conductive sheet sealed in a case;
the end section and the packaged semiconductor device are external to the case; and
the support extends from the conductive sheet, out of the sealed case, to the end section.

9. The method of claim 1, wherein:
the support is a first support to electrically couple the end section to an electrical bus; and
the electrical coupling further comprises a second support to electrically couple the end section to the electrical bus.

10. The method of claim 9, wherein:
the first support connects to a first side of the end section; and
the second support connects to a second side of the end section, the second side being opposite to the first side.

11. An apparatus, comprising:
a packaged semiconductor device having a plurality of leads; and
an electrical coupling comprising:
a substantially rectangular end section, the end section having a width greater than a width of a respective lead of the plurality of leads; wherein:
the respective lead is aligned within the width of the end section and welded to the end section; and
the respective lead extends in a direction substantially perpendicular to the width of the end section;
a support to electrically couple the end section to an electrical bus, wherein the support joins the end section such that:
a side of the support is substantially parallel to a side of the end section that corresponds to the height of the end section; and
the support has a narrower width than the width of the end section.

* * * * *